(12) United States Patent
Likovich, Jr. et al.

(10) Patent No.: US 7,237,210 B2
(45) Date of Patent: Jun. 26, 2007

(54) METHODS, SYSTEMS AND MEDIA FOR MANAGING FUNCTIONAL VERIFICATION OF A PARAMETERIZABLE DESIGN

(75) Inventors: Robert Brian Likovich, Jr., Raleigh, NC (US); Joseph David Mendenhall, Cary, NC (US); John Christopher Morris, Durham, NC (US); David Otero, Cary, NC (US); Chad Everett Winemiller, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 11/053,220

(22) Filed: Feb. 8, 2005

(65) Prior Publication Data

US 2006/0190871 A1 Aug. 24, 2006

(51) Int. Cl.
*G06F 17/50* (2006.01)
*G06F 9/45* (2006.01)
(52) U.S. Cl. ................................. 716/5; 716/4; 716/18
(58) Field of Classification Search ............... 716/1, 716/4–6, 18
See application file for complete search history.

(56) References Cited

U.S. PATENT DOCUMENTS 6,182,258 B1 * 1/2001 Hollander .................. 714/739
6,490,711 B2 * 12/2002 Buckley, Jr. ................ 716/5
6,530,054 B2 * 3/2003 Hollander .................. 714/739
6,581,191 B1 * 6/2003 Schubert et al. ............. 716/4
6,591,403 B1 * 7/2003 Bass et al. .................. 716/5
7,165,231 B2 * 1/2007 Buckley, Jr. ................ 716/5

* cited by examiner

*Primary Examiner*—Vuthe Siek
*Assistant Examiner*—Nghia M. Doan
(74) *Attorney, Agent, or Firm*—Joscelyn G. Cockburn; Schubert Osterrieder & Nickelson PLLC

(57) ABSTRACT

Methods, systems, and media for managing functional verification of a parameterizable design are disclosed. Embodiments include a system having a testbench configuration module adapted to configure a testbench, the testbench having testbench signals and one or more instantiated components having a plurality of ports of a generic design, where the testbench signals are wired to the plurality of ports. The testbench may also have one or more instantiated special components based on chip-specific versions of the design where the special components are wired to the same ports as the generic design. The system may also include a functional verification manager that, through a component module, observes values in the testbench and automatically configure a verification environment based on the observed values, including automatic insertion of checkers at different levels of hierarchy. The testbench may be a VHDL or Verilog testbench in some embodiments.

16 Claims, 4 Drawing Sheets

METHODS, SYSTEMS AND MEDIA FOR MANAGING FUNCTIONAL VERIFICATION OF A PARAMETERIZABLE DESIGN

CROSS-REFERENCES TO RELATED APPLICATIONS

Pursuant to 35 USC §119(e), this application claims priority to and benefit of U.S. patent application Ser. No. 11/053,078, entitled "METHODS, SYSTEMS, AND MEDIA FOR FUNCTIONAL SIMULATION OF NOISE AND DISTORTION ON AN I/O BUS", filed on the same day, the disclosure of which is incorporated herein in its entirety for all purposes.

FIELD OF INVENTION

The present invention generally relates to the field of functional simulation and verification of complex systems. More particularly, the present invention relates to methods, systems, and media for managing functional verification of a parameterizable design.

BACKGROUND

When designing increasingly complex processors or IC chips such as Application-Specific ICs (ASICs) and system-on-chips (SoC's), functional verification has proven to be a major bottleneck in achieving time-to-market goals. Many companies now realize that functional verification of complex chips has become an inefficient, unwieldy, and incomplete process. Design teams report that functional verification of medium- to large-complexity processors, ASICs or SOC's may consume over 70% of the project's manpower, schedule and budget. In spite of the time and resources consumed by functional verification, it is still often incomplete, allowing design bugs to go undetected. Improved functional verification can cut costs, improve design quality and accelerate time-to-market, as well as allowing companies to sharply increase the productivity of precious verification personnel.

The design process for a chip starts with the creation of a functional specification for the design. Once the functional specification has been completed, the verification team typically creates a test plan that specifies the design features and functions to be tested at both the block and system levels. The verification team then creates tests to verify design functionality until all test plan requirements have been met. The verification process involves developing and simulating tests that are used to determine whether design components (e.g., processor units, I/O units, resources, functions, etc.) behave according to their functional specification in a process known as functional simulation. Functional verification is often an iterative process where the entire system (or at least all its major features) is tested or functionally simulated on a continuous basis for the duration of the design process. Functional verification is typically completed before fabrication, as finding and fixing errors, or bugs, after fabrication proves to be time-consuming and expensive. Functional coverage is the study and analysis of the quality and completeness of functional verification. It includes statistical, stochastic and heuristic analysis of functional verification progress and completeness.

Formal methods can be applied to the design for verification of design features, as well as identifying design connectivity and signal propagation characteristics. In most such cases, a set of formal rules or design behavior specifications are defined and applied against a compiled model of the design to identify any deviation from the formal specification (rules). Some tools can generate a set of checkers and monitors from the formal rules which can then be used along with the simulation-based verification.

Software tools have been developed to help designers and testers with the functional verification process. A design under test (DUT) may be described using a hardware description language (HDL) such as VHSIC (Very High Speed Integrated Circuits) HDL (VHDL) or Verilog. Automation tools such as Verisity Design, Inc.'s (Verisity's) Specman testbench automation software provide an environment for generation of functional tests, data and temporal checking, functional coverage analysis, and HDL simulation control.

Some design components require sophisticated modeling in order to properly simulate their performance (and thus to complete functional verification). Functional verification of a high-speed, self-aligning, elastic I/O design, for example, poses problems with existing verification environments. An I/O design, for example, may ultimately be used in a number of different chips, each chip requiring a different size, shape, speed, and FIFO (First In, First Out) size due to its intended function and use. Each of these variations needs to be functionally simulated and verified. Functionally verifying these different variations results in a large number of different configurations needing to be stored and managed, wasting resources in storage and personnel time. These variations also necessitate reconfiguring the verification environment repeatedly to account for different I/O designs, releases, versions, and the like, again utilizing valuable resources. There is, therefore, a need for an improved mechanism for managing functional verification of parameterizable components such as I/O bus designs.

SUMMARY OF THE INVENTION

The problems identified above are in large part addressed by methods, systems, and media for managing functional verification of a parameterizable design. One embodiment generally provides a method for configuring a testbench using hardware design language configurations where the testbench has one or more parameterizable components. The hardware design language configurations may provide an indication of which of the one or more components are used to configure the testbench. The method may further include observing values in the testbench and automatically configuring a verification environment based on the observed values. Further embodiments of the method may include accessing files associated with the design, compiling files associated with the design, and storing the compiled code in a compiled library specified in a Makefile. Additional embodiments may include creating a series of base checker unit types based on hierarchy layers in the design and creating a series of structs based on the hierarchy layers that can dynamically match the design to provide a flexible checking environment. Further embodiments may include where configuring the testbench includes instantiating a component of a generic design in the testbench where the testbench has testbench signals and the component has a plurality of ports, with the testbench signals being wired to all of the ports. Configuring the testbench may also include in response to a chip-specific design with different ports than the generic design, instantiating in the testbench one or more special components where the special components are wired to the same ports as the generic design.

Another embodiment provides a machine-accessible medium containing instructions effective, when executing in a data processing system, to cause the system to perform a series of operations for synchronizing a database on a network. The series of operations generally includes configuring a testbench using hardware design language configurations where the testbench has one or more parameterizable components. The hardware design language configurations may provide an indication of which of the one or more components are used to configure the testbench. The series of operations may further include observing values in the testbench and automatically configuring a verification environment based on the observed values. Further embodiments may include accessing files associated with the design, compiling files associated with the design, and storing the compiled code in a compiled library specified in a Makefile. Additional embodiments may include creating a series of base checker unit types based on hierarchy layers in the design and creating a series of structs based on the hierarchy layers that can dynamically match the design to provide a flexible checking environment. Further embodiments may include where configuring the testbench includes instantiating a component of a generic design in the testbench where the testbench has testbench signals and the component has a plurality of ports, with the testbench signals being wired to all of the ports. Configuring the testbench may also include in response to a chip-specific design with different ports than the generic design, instantiating in the testbench one or more special components where the special components are wired to the same ports as the generic design.

A further embodiment provides a system for managing functional simulation of an I/O bus design. The system may include a user interface adapted to receive user input and a testbench configuration module. The testbench configuration module may in one embodiment configure a testbench having testbench signals and an instantiated component having a plurality of ports of a generic design where the testbench signals are wired to the plurality of ports. The testbench may also have one or more instantiated special components based on chip-specific versions of the design where the special components are wired to the same ports as the generic design. The system may also include a verification component manager to observe values in the testbench and to automatically configure a verification environment based on the observed testbench values. The testbench may be a VHDL or Verilog testbench in some embodiments.

BRIEF DESCRIPTION OF THE DRAWINGS

Other objects and advantages of the invention will become apparent upon reading the following detailed description and upon reference to the accompanying drawings in which, like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Methods, systems, and media for managing functional verification of a parameterizable design are disclosed. Embodiments include a system having a testbench configuration module adapted to configure a testbench, the testbench having testbench signals and one or more instantiated components having a plurality of ports of a generic design, where the testbench signals are wired to the plurality of ports. The testbench configuration may also have one or more instantiated special components based on chip-specific versions of the design where the special components are wired to the same ports as the generic design. The system may also include a functional verification manager that, through a component module, observes values in the testbench and automatically configures a verification environment based on the observed values, including automatic insertion of checkers at different levels of hierarchy. The testbench may be a VHDL or Verilog testbench in some embodiments.

The methods, systems, and media of the disclosed embodiments provide an improved mechanism for managing functional verification of parameterizable designs such as I/O bus designs. The mechanism of the disclosed embodiments provides improved efficiency for simulating and verifying parameterizable designs by reducing the effort and resources required to create and manage testbenches and tests. The resources spent managing data and files may be significantly reduced by the mechanism of the disclosed embodiments. Similarly, the creation of a specific configuration of a verification environment may be automatically accomplished, further reducing the verifier resources necessary to functionally verify a design. These efficiencies that may be gained from the disclosed embodiments may be further increased when chip-specific designs or different releases of a design need be verified, as the mechanism of the disclosed embodiments may automatically adapt to specific designs and different releases.

Figure 1:
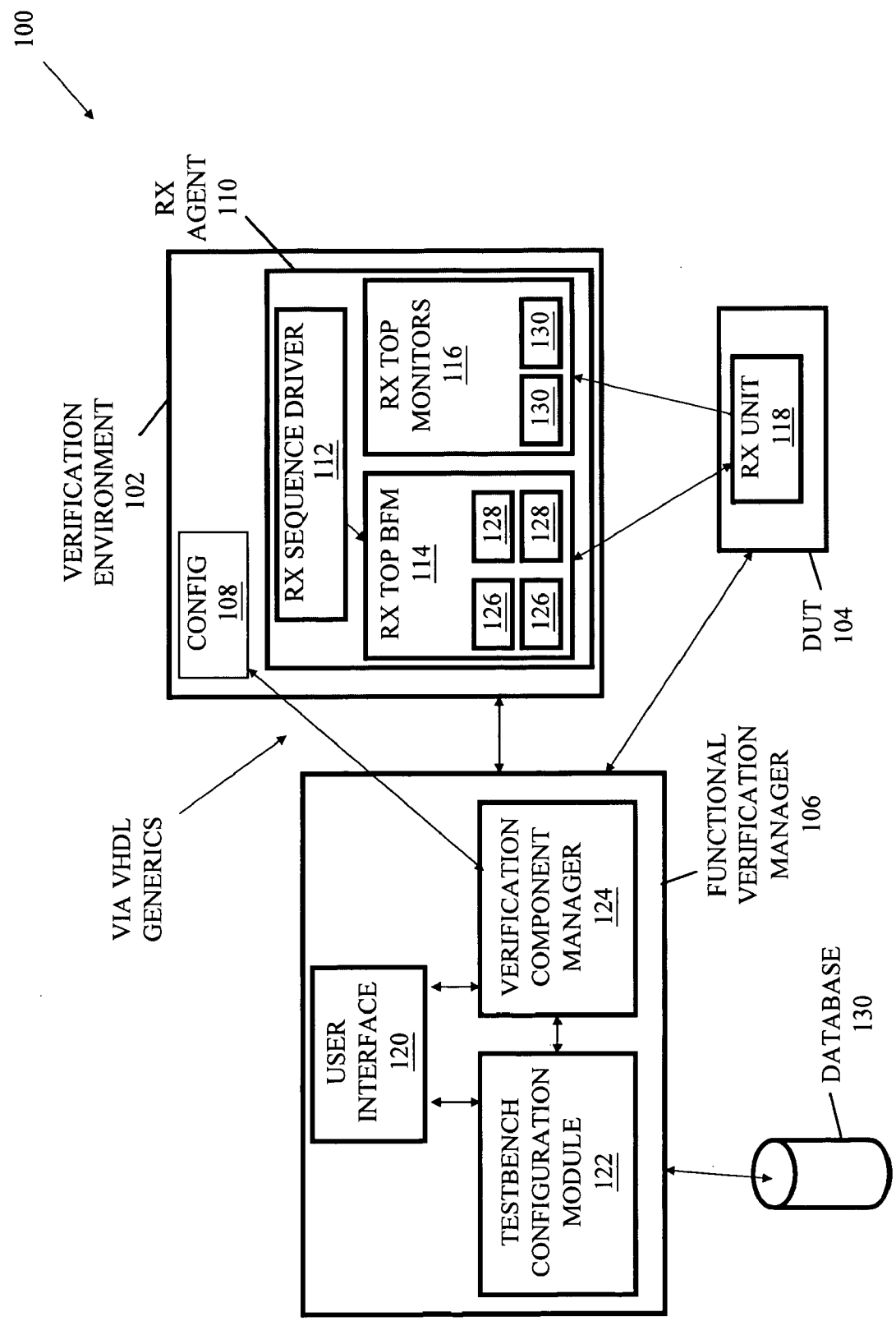
FIG. 1 depicts an environment for managing the functional verification of a parameterizable design according to one embodiment.

Turning now to the drawings, FIG. 1 depicts an environment for managing the functional verification of a parameterizable design according to one embodiment. Functional verification system 100 may include a verification environment 102 in communication with a design under test (DUT) 104, which may represent an I/O bus design or other design. The verification environment 102 may simulate various states of the DUT 104 and eventually verify its performance and design. Functional verification system 100 may also include a functional verification manager 106 for managing the functional simulation and verification of multiple designs. The verification environment 102, DUT 104, and functional verification manager 106 may, in one embodiment, be software and/or state machines implemented on one or more of any type of computer system, including servers, personal computers, workstations, mainframe computers, notebook or laptop computers, desktop computers, or the like. In one example, the functional verification system 100 or any of its components may be implemented on an IBM® eServer or similar server having one or more processors, or threads of processors, executing software and/or one or more state machines coupled with data storage devices such as random access memory (RAM), read only memory (ROM), flash memory, compact disk drives, hard drives, and the like.

The DUT 104 may represent a parameterizable design such as an I/O bus design that is being functionally simulated and verified by the functional verification system 100. The DUT 104 may be described using a hardware description language such as VHDL or Verilog. During verification, the verification environment 102 may drive the DUT 104 to simulate various test conditions. The DUT 104 may include an RX unit 118. In one embodiment, the DUT 104 may represent a high-speed, self-aligning, elastic I/O design. The methodology of the disclosed embodiments may advantageously adapt to different designs having different bus widths, hierarchical boundaries, FIFO depths, and the like, providing a scaleable solution to functionally verifying designs that change by release, during the design process, etc.

The verification environment 102 may be a software tool that helps designers and testers with the functional verification process by automating the configuration of testbenches, running simulations, and the like. The verification environment 102 may generate design stimuli, provide stimulus to the DUT 104, and then monitor and check the responses to the stimulus, providing an effective means of simulating a given design. Verification environment 102 may include any simulators or tests that are used in the functional verification process. The simulators and/or tests may be distributed over multiple servers or computers. Simulations (including tests or the results of simulators) may test for failures (also known as bugs or faults) in the design, which are situations where the logic expressed in the design language (e.g., VHDL, Verilog) does not perform correctly under specific situations. To handle the large amount of tests often necessary to properly verify a design, verification environment 102 may take advantage of existing verification automation tools such as Verisity's Specman testbench automation software, which provides an environment for generation of functional tests, data and temporal checking, functional coverage analysis, and HDL simulation control. Any other type of testbench automation software may be used, including code written in C++ or other languages.

In the depicted embodiment, verification environment 102 includes a configuration module 108 and an RX agent 110. The verification environment 102 may include other components as well, such as local clock agents or control agents, but FIG. 1 and its description are limited in the interest of clarity and brevity. The configuration module 108 may observe the values in the testbench (such as by the use of VHDL Generics) and automatically configure the verification environment 102 based on those values. The configuration module 108 may work with the verification component manager 124 of the functional verification manager 106 in some embodiments. The RX agent 110 (which may be an RX bus agent in one embodiment) may include an RX sequence driver 112, an RX top BFM 114, and an RX top monitor 116. The verification environment 102 may drive the DUT 104 by generating patterns and stimulus for the RX top BFM 114 of the RX agent 110 to transmit directly to the RX unit 118 of the DUT 104. The operation of the verification environment 102 of one embodiment is described in more detail in U.S. patent application Ser. No. 11/053,078, entitled "METHODS, SYSTEMS, AND MEDIA FOR FUNCTIONAL SIMULATION OF NOISE AND DISTORTION ON AN I/O BUS", incorporated previously herein.

The RX top BFM 114 may include one or more sub-BFMs, including clock sub-BFMs 126 or data sub-BFMs 128. Similarly, the RX top monitor 116 may include one or more sub-monitors 130. The sub-monitors and sub-BFMs may represent multiple instances of monitors and BFMs instantiated by the verification environment 102. Each sub-monitor and sub-BFM may represent a particular layer of hierarchy. Layers of hierarchy ('group', 'pack', 'cust', and 'bit' in descending order of size in one embodiment) may be used to logically and physically divide up the bits on the bus or other design to best suit the use in the end chip product. For example, a RX top monitor 116 may include a plurality of bit-level sub-monitors, a plurality of group-level sub-monitors, and the like.

The functional verification manager 106 may include a user interface 120, a testbench configuration module 122, and a verification component manager 124. The functional verification manager 106 and/or its components may include or be in communication with a database 130 for storage of files such as libraries, configurations, and compiled code. User interface 120 may receive input from a user, such as via a keyboard or pointing device, and may also communicate output to the user, such as via a monitor, auditory signal, or printer.

In one embodiment, the testbench configuration module 122 may access a design testbench manually created by a verifier. The verifier may instantiate all of the components and then bind the correct one with a VHDL configuration. The verifier, when creating the testbench may also manually create the signals and components, as well as instantiating the components, as part of the created testbench. The testbench signals may be wired to every port of the VHDL component, which may control the sizes of the testbench signals. The verifier may create a VHDL component of the generic version of the design and any special VHDL components for the chip-specific or alternate designs. The verifier may also instantiate the generic components in the testbench as well as the special components, in the event the chip-specific versions contain different ports or different numbers of ports than the generic logic. The testbench configuration module 122 may then configure the VHDL testbench and bind the appropriate component based on a generic design as well as variations on that design associated with a chip-specific or other alternative designs. The special VHDL components may be advantageously tied to the same testbench signals as the main generic VHDL component to provide a common point into which the verification environment 102 may be connected.

After the testbench configuration module 122 configures the testbench, the verification component manager may then observe the values of the testbench configuration module 122 to configure, in conjunction with the configuration module 108, a verification component to match the design being verified. The testbench configuration module 122 may generate and store compiled code for each design. The verification component manager 124 and/or configuration module 108 may, in some embodiments, utilize Specman or other testbench automation software to perform its functions, such as by using a Specman eVC ('e' verification component, where 'e' is the Specman verification language). After the verification component is configured, it may then be set up and verified in the verification environment 102. The verification component manager 124 and/or configuration module 108 may configure the verification component automatically, saving personnel time and resources.

Previous systems for functional verification required significant management by verifiers to properly configure the verification environment 102 and the VHDL environment. One method involved creating a unique VHDL testbench for each configuration with the design instantiated within it and with all of the components and wiring connections specified in the testbench. A separate verification environment 102 configuration would then be created to match each parameter of the testbench. A verifier would need to match up the VHDL testbenches and the verification environment 102 configurations and load these into each testcase run to simulate the design. This solution required wasted resources and redundancy because of the specification of the wiring connections in each testbench and the need to create a replica of the verification environment configuration. Moreover, the verifier would need to manually pair the two separate configurations each time a testcase needed to be run, making it difficult to work with multiple configurations, resulting in more errors, and requiring more effort from the verifier. The mechanism of the disclosed embodiments provides for automation and efficiency by handling the management of data and files as well as automatically configuring the verification environment 102 based on the design. When different chip versions or releases need to be verified, the mechanism of the disclosed embodiments may also automatically handle, after some initial setup, these situations.

Figure 2:
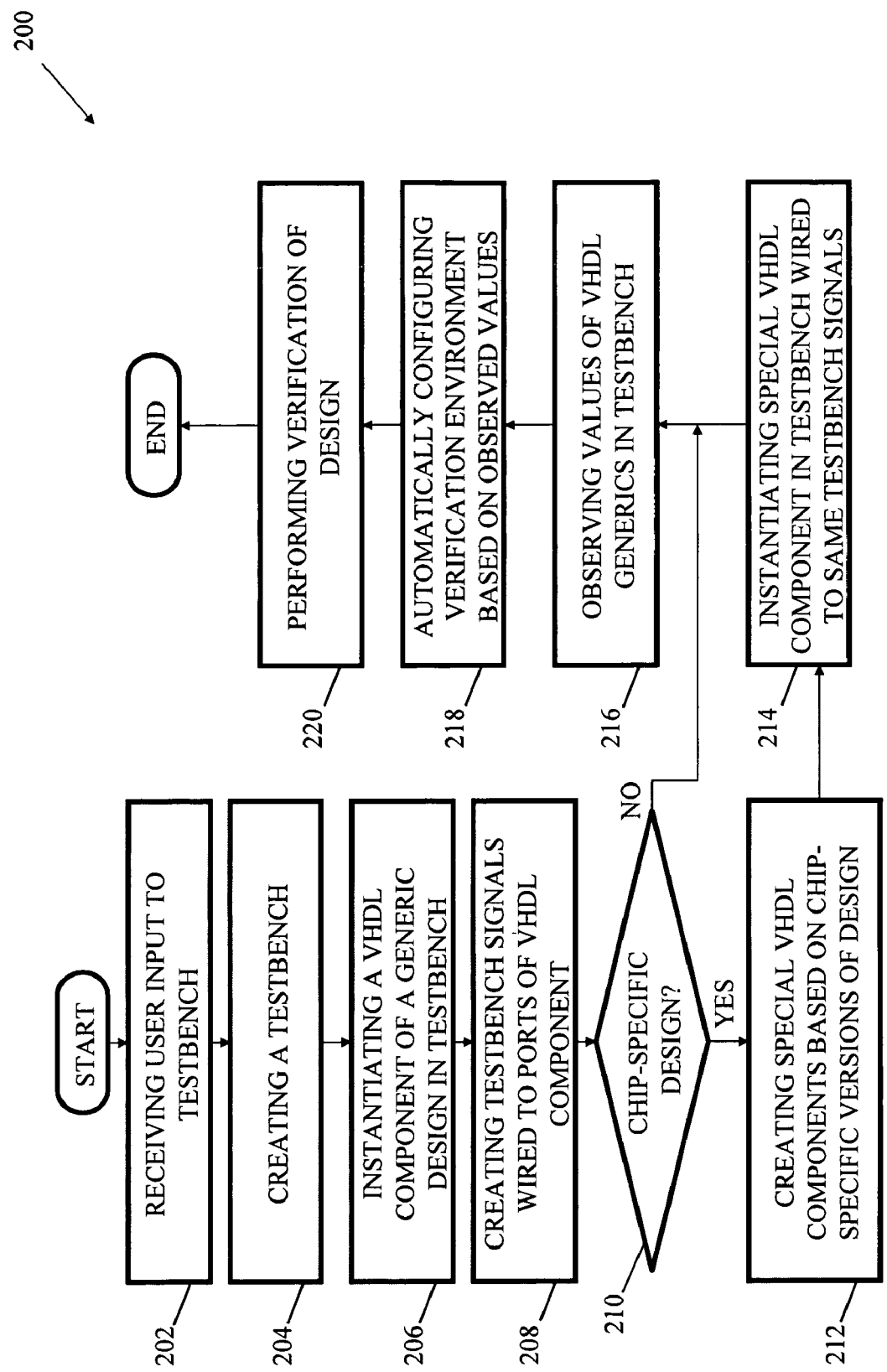
FIG. 2 depicts an example of a flow chart for managing the verification environment for functional verification of a parameterizable design according to one embodiment.

FIG. 2 depicts an example of a flow chart for managing the verification environment for functional verification of a parameterizable design according to one embodiment. The elements of flow chart 200 may be performed, in one embodiment, by components or combinations of components of the functional verification system 100. Flow chart 200 begins with element 202, receiving user input to a testbench. In one embodiment, the user interface 120 may receive the input from the user. The user input may be a request to perform functional verification on a particular chip design, including an indication of the chip, the particular design, any chip-specific configurations, the release of the design, or the location or identity of files associated with the design. User input may also include any other information such as particular requests relating to the functional verification (priority, timing, allocated resources, and the like).

After receiving input from the user, flow chart 200 continues to element 204, creating a testbench. In one embodiment, the verifier or other user may perform element 204 by manually creating a VHDL testbench. While the use of VHDL is described in the embodiment of FIG. 2 and subsequent figures, the testbench configuration module 122 may use any other hardware design language, such as Verilog, instead of VHDL to perform its tasks. After the testbench is created, the verifier (or alternatively the testbench configuration module 122) may instantiate a VHDL component of a generic design (which may be specified by the user) in the testbench at element 206. Instantiation of a VHDL component is necessary for use of VHDL configurations. In one embodiment, the verifier may set VHDL Generics to the testbench to configure the generic I/O logic. VHDL Generics (similarly to Verilog Parameters) are generally used to construct parameterized hardware components. At element 208, the verifier may create testbench signals that are wired to every port of the VHDL component, which itself may control the sizes of the testbench signals.

If a generic design is to be tested, the testbench may be considered complete, but additional configuration may be necessary for chip-specific designs. At decision block 210, the testbench configuration module 122 may determine whether a chip-specific version of a design is needed that requires different ports or different numbers of ports. In one embodiment, chip-specific versions may only have the same number of ports or less ports as the generic logic is a superset of port configurations. If the ports differ and a chip-specific design is needed, flow chart 200 continues to element 212, and if one is not needed, flow chart 200 continues to element 216.

At elements 212 and 214, the testbench configuration module 122 may configure the testbench to account for the chip-specific design. Chip-specific designs account for variations in chip designs, as each chip may require a different size, shape, speed, and FIFO depth due to its intended function and use. The shape of a design may be described by different layers of hierarchy used to logically and physically divide up the bits on the bus to best suit the use in the end chip product. Accordingly, a chip-specific version of a design may have different ports or a different number of ports than the generic design logic. Because the ports may be different, the verifier may create special VHDL components based on the chip-specific version of the design at element 212 and instantiate any special VHDL components in the testbench at element 214. The special VHDL components may be advantageously tied or wired to the same testbench signals as the main generic VHDL component so that the verification environment 102 has a common point to tie into regardless of whether generic or specific designs are utilized.

Elements 206, 208, 210, 212, and 214 may be repeated to create many different VHDL configurations in which the design may run. In one embodiment, all of the different VHDL configurations may be created. These configurations may specify the values of the VHDL Generics as well as the wiring of the actual design to the component in the event that the port names differ. In one embodiment, only a single VHDL component may be bound to an entity to prevent signal resolution problems.

After a testbench has been created and populated, flow chart 200 continues to element 216. At element 216, the verification component manager 124 may use a single base configuration (e.g., a Specman configuration) to observe the values of the VHDL generics in the testbench and may, at element 218, configure a verification component (such as a Specman eVC) of the verification environment 102 to match the design being verified. The verification component manager 124 may work in conjunction with the configuration module 108 of the verification environment 102 to perform its tasks, such as by relaying the observed values and/or the configuration to the configuration module 108 for completion of the verification component configuration. Using a single base configuration removes the burden from the verifier of having to maintain multiple files specifying different configures. A single base configuration also may allow a verifier to avoid maintaining and running a script to automatically create configurations based on the logic being verified. In previous systems, a configuration would need to be created to match each parameter used in a particular testbench. To functionally simulate a design, the verifier would have to match up the VHDL testbenches with the verification environment 102 configurations and load these into each testcase run. This resulted in significant redundancy with the specification of wiring connections in each testbench as well as redundancy in creating a replica of this configuration in the verification environment 102. Moreover, the verifier would need to pair these two separate configurations each time a testcase needed to be run, resulting in even more resource usage. The method of the disclosed embodiments allows for the verification environment 102 and its verification component to be adapted automatically to a particular chip-specific design without having to duplicate the VHDL configuration each time.

Figure 3:
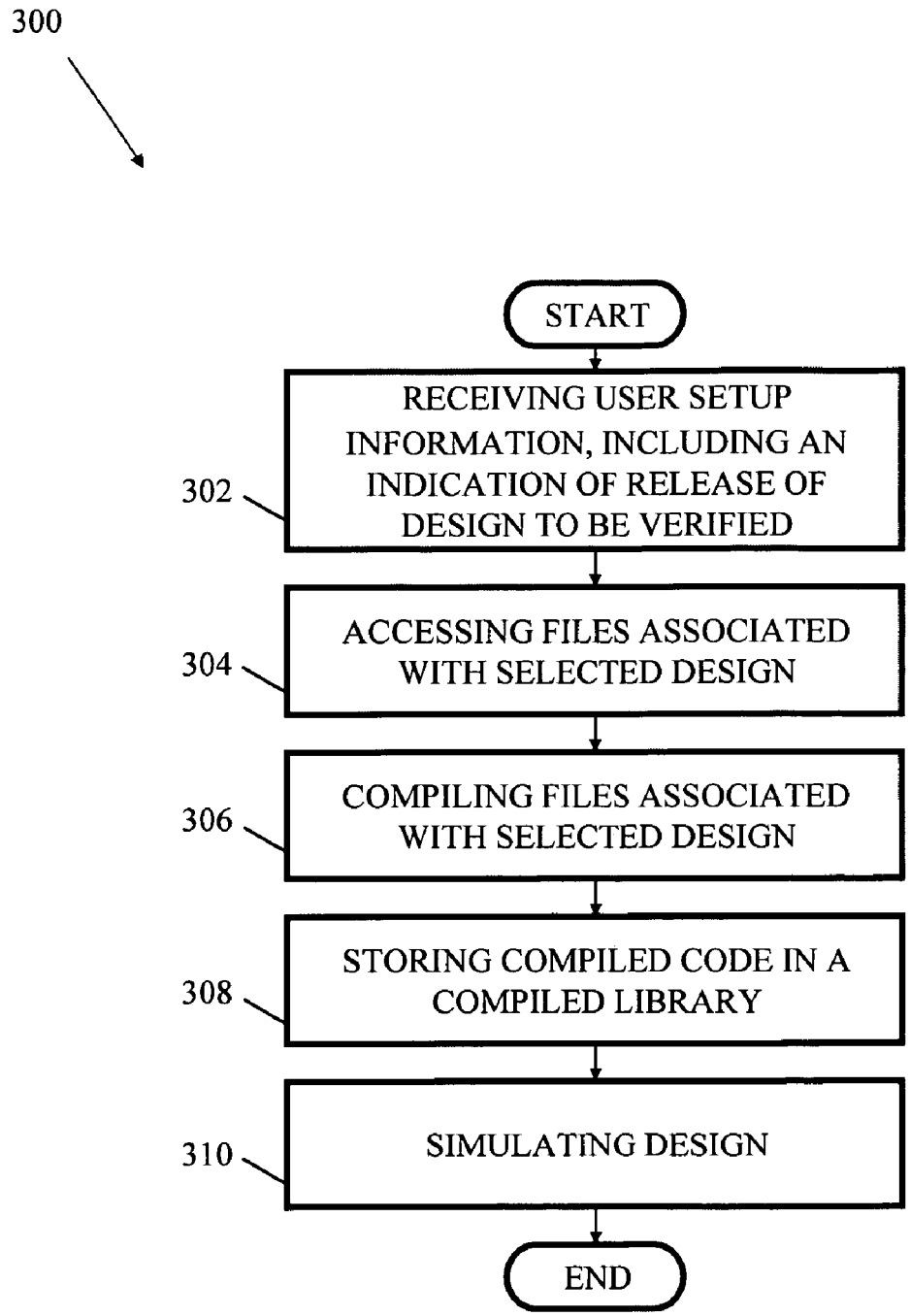
FIG. 3 depicts an example of a flow chart for managing files associated with verification of a parameterizable design according to one embodiment.

The method of the disclosed embodiments may also provide benefits when dealing with different releases of a design, as described in more detail in relation to FIG. 3. A release represents the logic design frozen at a particular point and is often used, for example, to pass off the design to back-end teams to perform their testing. Chip-specific releases may be dependent on the same common VHDL libraries but may be dependent on different releases, or versions, of these libraries. Under previous systems, verifiers would have to manually delete libraries and manually compile new libraries to be placed in the proper locations, making it impossible for verifiers to simulate more than one configuration at one time. The method of the disclosed embodiments allows a verifier to 'point' to the correct library so that any of a group of configurations may be used for a simulation, eliminating the need for manually scripting, copying and deletion of directories, and the like.

After the verification environment 102 has been configured, flow chart 200 may continue to element 220, performing the verification of the design, after which the flow chart terminates. This element may be performed by the verification environment 102 in one embodiment. In this embodiment, the verification environment 102 may generate sequences (by the RX sequence driver 112) that represent high-level representations of stimulus of the DUT 104 that are then sent to the RX agent 110 for transmission to the DUT 104. The bus agent 110 and its components may stimulate and monitor the DUT 104 to perform the functional simulation and verification of the design of the DUT 104.

FIG. 3 depicts an example of a flow chart for managing files associated with verification of a parameterizable design according to one embodiment. The elements of flow chart 300 may be performed, in one embodiment, by components or combinations of components of the functional verification manager 106. The method of flow chart 300 may supplement and work in conjunction with the method of flow chart 200 by providing improved file management capabilities. Flow chart 300 may be implemented, in one embodiment, by a script executed by a user.

Flow chart 300 begins with element 302, receiving user setup information, including an indication of the release of the design to be verified. User setup information may include any user preferences regarding the configuration of the verification environment 102, including the location of existing files, the location of compiled files, and whether the user wishes for a simulation to execute. The indication of the release of the design to be verified may be a release name or other identifier or the base directory where the VHDL and supporting files are stored. In one embodiment, the user setup information may first be received by the user interface 120 at element 202 of FIG. 2 where user input to the testbench is received. A user, for example, may simply specify a release name or identifier or may identify the base directory where the VHDL and supporting files are stored or provide other user setup information. A user executing a script, in another example, may specify the release name or the location of the base directory when they initiate the script. In another example, the indication of the design release may be found in a file configured by a user.

If a script is used to input user setup information, the user may use options to specify the user setup information at script initiation. Example options a user may add to a script initiation command may include a release directory flag, a project name flag, a compile flag, an elaboration flag, clean flags, or a launch flag. The release directory flag (which may be called using a '-r' followed by a directory name) may allow a user to specify, for example, a release directory containing the VHDL code of the top-level I/O bus configurations for a specific chip. A user may utilize the release directory flag to specify the release to be verified by using the appropriate directory. The directory may contain a file, which may be known as a 'Releasefile', which lists all of the libraries necessary to compile the particular release, as well as the release number of each library. If the user does not utilize a release directory flag, the generic design VHDL may be used for verification. The project name flag ('-n' followed by a project name in one embodiment) may allow a user to manually specify the project-name of the top-level files to be compiled. The project name may be used as a suffix for the compiled library directory as well as a prefix for the logical library name. If no name is specified, a project name may be derived from the release directory name.

The Makefile, which may be manually created, may specify the generic VHDL and all of its dependencies on other base libraries as a target. Any chip-specific versions of the designs to be simulated may also be specified as targets in the Makefile. The specification of the dependent libraries in the Makefile may then be shared among all of the chip-specific targets and the generic target in the Makefile. A verifier may set up the Makefile manually or the script may alternatively automatically add new targets to the Makefile in response to new release directory tags.

Users may also specify other flags as part of a script initiation. The compile flag ('-c' in one embodiment) may allow a user to compile the design top-level VHDL files and supporting files, including libraries. The elaboration flag ('e' in one embodiment) may allow a user to elaborate specific top-level VHDL files and supporting files, including libraries. The clean flags ('-t' and '-a' in some embodiments) may allow a user to clean compiled libraries, such as VHDL libraries, pointed to by the project name tag. The compile, elaboration, and clean flags may be used for both specific releases as well as the generic VHDL. A user may specify a launch flag ('-x' in one embodiment) to launch a new window or program with the newly created environment setup. The described tags are only examples and one skilled in the art will recognize that other or different tags may also be used.

After receiving user setup information, the method of flow chart 300 continues to element 304, accessing files associated with the selected design. The selected design may be, for example, the design associated with the release specified by the user. Depending on the user setup information, the files associated with the selected design may be located in one or more directories. For example, generic design libraries as well as release-specific libraries may be specified, each in different directories. In one embodiment, all of the associated files are copied to one directory (which may be a temporary directory) if they are spread across two or more directories for ease of compilation. All of the top-level VHDL files, for example, along with all supporting VHDL files may be copied to a temporary directory. Next, the files associated with the selected design may be compiled for execution at element 306. A verification program such as NC-Sim from Cadence Design Systems of San Jose, Calif. may compile and/or elaborate the design for testing.

After code has been compiled, it may be saved to a separate compiled library location at element 308. Both generic and each chip-specific versions of the code may be stored and maintained in the compiled library, allowing verifiers to have access to compiled code for multiple configurations simultaneously. Previous systems did not allow verifiers to easily access multiple configurations, necessitating labor-intensive moving of files or recompiling code whenever designs for verification changed. At optional element 310, the design may then be simulated using the compiled executable code for the design, after which the method terminates.

The Makefile and the method of flow chart 300 advantageously allow environment variables to be set up by the front-end script (as described in relation to elements 304 through 308) and for compiling releases of the design using any version of dependent libraries. The Makefile and method also provide for storage of the compiled releases into unique physical library locations, allowing the verifier to simultaneously work on multiple configurations.

Figure 4:
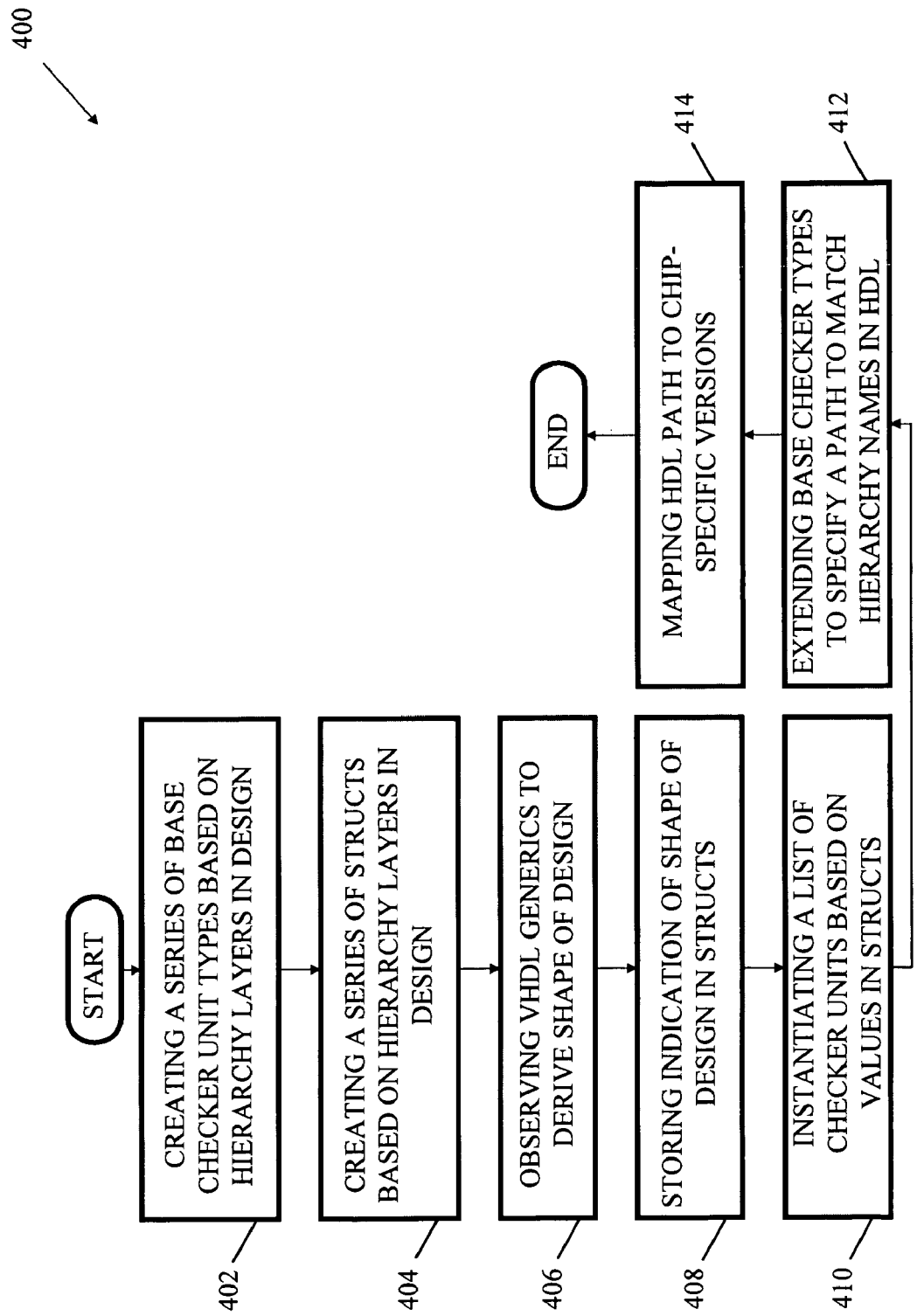
FIG. 4 depicts an example of a flow chart for automatically configuring a verification environment according to one embodiment.

FIG. 4 depicts an example of a flow chart for automatically configuring a verification environment according to one embodiment. The elements of flow chart 400 may be performed, in one embodiment, by components or combinations of components of the functional verification manager 106, such as the verification component manager 124, or may be performed by a verifier. The method of flow chart 400 may supplement and work in conjunction with the method of flow chart 200 in one embodiment by providing configuration of a verification environment by automatically inserting checkers into a design regardless of the hierarchy of the particular design. In one embodiment, elements of the method of flow chart 400 may correspond to elements 206, 208, 212 and 214 of FIG. 2 where the testbench configuration module 122 configures the testbench to account for the chip-specific design. As described previously, chip-specific designs may be described by different layers of hierarchy used to logically and physically divide up the bits on the bus. During verification, it may be desirable to probe into the hierarchy of a design to check the values of signals to verify that the logic is operating as specified. As the hierarchy may change with every configuration, previous systems required verifiers to manually insert the checkers into the design for each configuration, resulting in a significant amount of time and effort. For example, the number of checkers varies based on the number of bits in the design (i.e., the size) and the numbers of intermediate hierarchy levels (i.e., the shape). The inserted checkers may be represented by the sub-monitors 130 of FIG. 1. The method of FIG. 4 advantageously provides an automatic method of configuring a verification environment based on different configurations and hierarchies.

The method of flow chart 400 begins at element 402, where the verifier may create the base checker unit types based on the hierarchy layers in a design. In one embodiment, for example, the verifier may generate base checker unit types for the 'group', 'pack', 'cust', and 'bit' level. After creating the base checker unit types, the verifier may next create 'structs' based on the hierarchy layers of the design at element 404. The 'structs' may represent the different hierarchy layers present in the actual design and can store the number of physical instances of base checker unit types at each hierarchy layer. Each 'struct' may thus store the quantity of checkers at each level of the hierarchy. The number of physical instances may be represented by an integer stored in a field of the 'struct'. For example, a 'struct' may contain an indication that there are two 'groups', that each group has two 'packs', that each 'pack' has four 'bits' and that there is no 'cust' level. This example may result in two 'group' checker units, four 'pack' checker units, and sixteen 'bit' checker units.

An example of Specman code to create a series of structs representing the layers in the hierarchy of a design is described below. While Specman code is included for explanatory purposes, one skilled in the art will recognize that any type of code may be used. First, a top-level struct mirroring the top-level piece of hierarchy in the design ('group' from the previous example) may contain a list of another struct representing the next lower level of hierarchy, the size of which may be later determined by observing VHDL generics at element 406. This procedure may continue until all of the levels of hierarchy are exhausted and a struct is created for the lowest level of hierarchy. Example top level code (based on Specman code) may include:

```
struct hier_top_s {
    num_hier_mid    : uint;
    hier_mid_l      : list of hier_mid_s;
    keep hier_mid_l.size( ) == num_hier_mid;
};
```

In this example, 'uint' represents an unsigned integer and there are a 'uint' number of mid-level structs (the number determined at element 406) and an instance of each struct may be included in the list (e.g., hier_mid_1, etc. up to hier_mid_N where N equal 'num_hier_mid'). Similarly, any mid-level structs (e.g., 'pack', 'cust', etc.) are created next, and example mid-level code may include:

```
struct hier_mid_s {
    num_hier_bot    : uint;
    hier_bot_l      : list of hier_bot_s;
    keep hier_bot_l.size( ) == num_hier_bot;
};
```

An example bottom-level struct (e.g., 'bit') may include:

```
struct hier_bot_s {
    num_bits    : uint;
};
```

As the bottom-level struct is the final level of hierarchy, additional layers of structs or hierarchy need not be specified. After creating the structs for a top-level struct, a list of instances of the top-level struct may be created, as shown by the following code:

```
num_hier_top    :uint;
hier_top_l      : list of hier_top_s;
keep soft hier_top_l.size( ) == num_hier_top;.
An instance for each top-level struct may be created.
```

After creating a series of structs, the verification component manager 124 may observe the values of the VHDL Generics and derive the shape of the design at element 406. Elements 406 may correspond to element 216 of FIG. 2. After deriving the shape of the design, the verification component manager 124 at element 408 may store an indication of the shape of the design within the structs created at element 408. If the verification component manager 124 derives the shape of the design as including two groups, for example, this information may be stored in the structs as described in relation to element 404.

After storing an indication of the shape of the design in the structs, the method of flow chart 400 continues to element 410, instantiating a list of checker units based on the values in the structs. The size of the list may be determined by probing into the top-level list of the struct and pulling out the correct number for that level of hierarchy. For example, if the struct indicates that there are eight bits in a struct, a total of eight bit checker units may be instantiated and placed in the list in the struct. The checker units may instantiate lists of each other, such as by higher-level checker units creating lower-level checker units. An example of code written in Specman to instantiate the checkers may include:

```
hier_top_monitors_l : list of hier_top_monitor_u;
keep hier_top_monitors_l.size( )    == agent.num_hier_top is instance;
keep for each (top_mon) in hier_top_monitors_l {
    top_mon.top_id              == index;
    top_mon.num_hier_mid        == agent.hier_top_l[index].
                                   num_hier_mid; };
```

The list of 'hier_top_monitor_X' variables represents a list of each top level checker (or monitor) in a verification environment. The value of 'agent.num_hier_top' may be set by observing the values of the VHDL Generics as the number of top level checkers. For each top level checker unit, a unique identifier (the 'index' variable) may be used. The top level list may also acquire from the structs the number of mid-level checkers that the method is trying to insert, resulting in the number being pulled out of the struct and being put into another variable (top_mon.num.hier_mid) inside the checker. Similarly, the lower level checkers may also be instantiated.

Once the checker units are instantiated, the verification component manager 124 may at element 412 extend the base checker types to specify a path (such as an hdl_path in Specman) based on the values stored in the structs to match the hierarchy names of the VHDL. The path may be the path of the HDL logic that represents where the checker is located within the logic. This will connect the checker unit to the correct hierarchy in the DUT 104. If Specman is used, element 412 may be accomplished by setting the correct hierarchy name for the current level in question in the Specman configuration file, taking advantage of Specman's feature of each instance inheriting the path from its parent. An example in Specman code may include:

```
extend hier_top_monitor_u {
    keep hdl_path ( ) == append ("top",
    top_id, ".top", top_id, "_inst");
};
extend hier_mid_monitor_u {
    keep hdl_path ( ) == append ("mid", mid_id, ".mid_inst");
};
```

In the above example, the new path (hd1_path) of all of the hier_mid_monitors would be "top<num>.top<num>_inst.mid<num>.mid_inst". Each <num>may match up with the index in the instantiation loops discussed previously and are unique for each checker. The methodology of element 412 may provide an advantage with configurable designs that use generate loops in VHDL based off of VHDL generics to instantiate variable numbers of objects in the design, as these generate loops may insert a number into the hierarchy name. The verifier need not worry about how many top-levels are instantiated, for example, or how many bit-levels are instantiated, in another example, as the Specman environment may handle this automatically using the method of the disclosed embodiments.

At alternative element 414, the verification component manager 124 may map the HDL path from element 412 to a chip-specific version of the design, after which flow chart 400 terminates. The methodology of element 414 may allow for use with chip-specific versions that differ significantly in their hierarchies from the base generic design. One methodology to accomplish this utilizes implication constraints based on 'kind' fields in Specman to perform the mapping. The 'kind' fields may be based on the VHDL Generic values in the logic. An example of code (based on Specman code for illustrative purposes) to accomplish this by may include:

```
extend hier_top_monitor_u {
    -- GENERIC
    keep '~/:/tb_inst/gENV_CONFIG' == 0 =>
    env_config == GENERIC;
    -- All others
    keep '~/:/tb_inst/gENV_CONFIG' != 0 =>
    env_config == GENERIC;
};
extend GENERIC hier_top_monitor_u {
    keep hdl_path ( ) == append ("top", top_id, ".top",
    top_id, "_inst");
};
extend SPECIFIC hier_top_monitor_u {
    keep hdl_path ( ) == append ("top", top_id, "_inst");
};
extend hier_mid_monitor_u {
    keep hdl_path ( ) == append ("mid", mid_id, ".mid_inst");
};
```

In this example, the method declares a 'kind' field called 'env_config' that is declared in the 'hier_top_monitor_u'. The 'kind' field may be constrained based on an implication from a VHDL generic value called 'gENV_CONFIG' that the verifier may set up in the VHDL testbench. The 'kind' field may be used to differentiate extensions of 'hier_top_monitor_u' in order to specify different paths (hdl_paths), allowing the verification component manager 124 to automatically adapt to chip-specific designs with significantly different hierarchies than generic designs.

Each software program described herein may be operated on any type of computer, such as personal computer, server, etc. Any programs may be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet, intranet or other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the present invention contemplates a methods, systems, and media for managing functional verification of a parameterizable design. It is understood that the form of the invention shown and described in the detailed description and the drawings are to be taken merely as examples. It is intended that the following claims be interpreted broadly to embrace all the variations of the example embodiments disclosed.

What is claimed is:

1. A method for managing functional verification of a parameterizable design, the method comprising:
   creating a testbench:
   configuring the testbench using hardware design language configurations, the testbench having one or more parameterizable components, wherein the hardware design language configurations provide an indication of which of the one or more parameterizable components are used to configure the testbench, wherein configuring the testbench comprises instantiating a component of a generic design in the testbench, the testbench having testbench signals and the component having a plurality of ports, the testbench signals being wired to all of the ports;
   determining whether the parameterizable design is a chip-specific design that requires different ports or a different number of ports than the generic design;
   in response to determining that the parameterizable design is a chip-specific design, instantiating in the testbench one or more special components, the special components being wired to the same ports as the generic design;
   observing values in the testbench;
   automatically configuring a verification environment to match the parameterizable design based on the observed values in the testbench to facilitate verification of the parameterizable design; and
   performing verification of the parameterizable design.

2. The method of claim 1, further comprising:
   accessing files associated with the design to be verified;
   compiling files associated with the design to be verified into compiled code; and
   storing the compiled code in a compiled library specified in a Makefile.

3. The method of claim 1, further comprising:
   creating a series of base checker unit types based on hierarchy layers in the design to be verified; and
   creating a series of structs based on the hierarchy layers that can dynamically match the design to provide a flexible checking environment.

4. The method of claim 1, further comprising:
   extending base checker types to specify a path to match hierarchy names in a hardware design language; and
   mapping the path to chip-specific versions.

5. The method of claim 1, wherein configuring the verification environment further comprises:
   deriving a shape of the design to be verified;
   storing an indication of the shape in one or more structs; and
   instantiating a list of checker units based on values in the one or more structs.

6. A machine-accessible medium containing instructions effective, when executing in a data processing system, to cause said data processing system to perform operations comprising:
   creating a testbench;
   configuring the testbench using hardware design language configurations, the testbench having one or more parameterizable components, wherein the hardware design language configurations provide an indication of which of the one or more parameterizable components are used to configure the testbench, wherein configuring the testbench comprises instantiating a component of a generic design in the testbench, the testbench having testbench signals and the component having a plurality of ports, the testbench signals being wired to all of the ports;
   determining whether the parameterizable design is a chip-specific design that requires different ports or a different number of ports than the generic design;
   in response to determining that the parameterizable design is a chip-specific design, instantiating in the testbench one or more special components, the special components being wired to the same ports as the generic design;
   observing values in the testbench;
   automatically configuring a verification environment to match the parameterizable design based on the observed values in the testbench to facilitate verification of the parameterizable design; and
   performing verification of the parameterizable design.

7. The machine-accessible medium of claim 6, further comprising:
   accessing files associated with the design to be verified;
   compiling files associated with the design to be verified into compiled code; and
   storing the compiled code in a compiled library.

8. The machine-accessible medium of claim 6, further comprising:
   creating a series of base checker unit types based on hierarchy layers in the design to be verified; and
   creating a series of structs based on the hierarchy layers that can dynamically match the design to provide a flexible checking environment.

9. The machine-accessible medium of claim 6, further comprising:
   extending base checker types to specify a path to match hierarchy names in a hardware design language; and
   mapping the path to chip-specific versions.

10. The machine-accessible medium of claim 6, wherein configuring the verification environment further comprises:

deriving a shape of the design to be verified;
storing an indication of the shape in one or more structs; and
instantiating a list of checker units based on values in the one or more structs.

11. A system for managing functional verification of a design, the system comprising:
a user interface, the user interface being adapted to receive user input;
a testbench configuration module, the testbench configuration module being adapted to configure a testbench having testbench signals and an instantiated component having a plurality of ports of a generic design in the testbench, wherein the testbench signals are wired to the plurality of ports of the generic design, the testbench also having one or more instantiated special components based on chip-specific versions of the design, the special components being wired to the same ports as the generic design; and
a verification component manager, the verification component manager being adapted to observe values in the testbench and automatically configure the verification environment to match the parameterizable design based on the observed testbench values to facilitate verification of the parameterizable design.

12. The system of claim 11, further comprising a configuration module of the verification environment in communication with the verification component manager, wherein the verification component manager and the configuration module configure the verification environment together.

13. The system of claim 11, wherein the testbench comprises one or more of a VHDL testbench or a Verilog testbench.

14. The system of claim 11, wherein the verification environment comprises one or more base checker unit types based on hierarchy layers in the design and one or more structs based on the hierarchy layers that can dynamically match the design to provide a flexible checking environment.

15. The system of claim 11, wherein the verification component manager is further adapted to derive a shape of the design and to store an indication of the shape in one or more structs, and wherein further the testbench configuration module is adapted to instantiate a list of checker units based on values in the one or more structs.

16. The system of claim 11, wherein the testbench configuration module is further adapted to compile files associated with the design into compiled code and to store the compiled code in a compiled library specified in a Makefile.

* * * * *